United States Patent [19]

Asano et al.

[11] Patent Number: 5,715,470

[45] Date of Patent: Feb. 3, 1998

[54] ARITHMETIC APPARATUS FOR CARRYING OUT VITERBI DECODING AT A HIGH SPEED

[75] Inventors: Nobuo Asano; Mitsuru Uesugi; Toshihiro Ishikawa, all of Yokohama; Minoru Okamoto, Osaka, all of Japan

[73] Assignee: Matsushita Electric Industrial Co., Ltd., Osaka, Japan

[21] Appl. No.: 126,563

[22] Filed: Sep. 27, 1993

[30] Foreign Application Priority Data

| Sep. 29, 1992 | [JP] | Japan | 4-259563 |
| Jun. 16, 1993 | [JP] | Japan | 5-144948 |
| Aug. 2, 1993 | [JP] | Japan | 5-191092 |

[51] Int. Cl.$^6$ ............................. G06F 7/00; G06F 15/00
[52] U.S. Cl. ............ 395/800; 364/768; 364/769; 364/763; 364/764; 364/715.08; 364/715.04; 365/230; 395/405; 395/436; 395/474; 395/495
[58] Field of Search ....................... 395/800, 425; 364/715.08, 715.04, 926.4, 926.5, 926.6, 244.4, 244.5, 259.5, 254.2, 244.8, 243; 365/230.03, 230.04

[56] References Cited

U.S. PATENT DOCUMENTS

| 4,488,252 | 12/1984 | Vassar | 364/748 |
| 4,622,877 | 11/1986 | Strong | 84/604 |
| 4,639,887 | 1/1987 | Farmwald | 364/748 |
| 4,872,128 | 10/1989 | Shimizu | 364/715.08 |
| 4,939,684 | 7/1990 | Gehrig et al. | 364/724.01 |
| 4,979,175 | 12/1990 | Porter | 371/43 |

FOREIGN PATENT DOCUMENTS 4 352 518  12/1992  Japan .

Primary Examiner—Tod R. Swann
Assistant Examiner—Denise Tran
Attorney, Agent, or Firm—Spencer & Frank

[57] ABSTRACT

An arithmetic apparatus in which while data read out of a memory is shifted by means of a barrel shifter by a shift bit number designated by data standing for an output signal of an inverter, data standing for an output signal of the barrel shifter is inputted to a shift register to thereby perform Viterbi decoding at a high speed.

6 Claims, 8 Drawing Sheets

F I G. 1
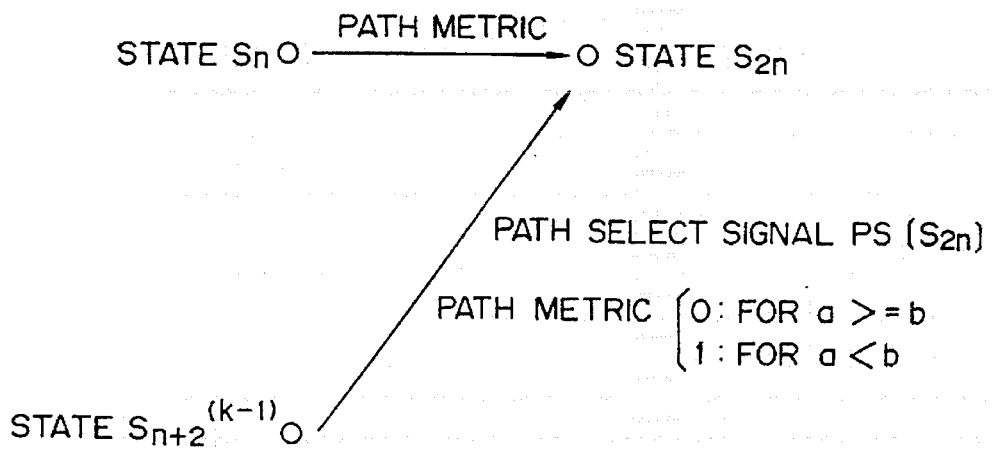
F I G. 2
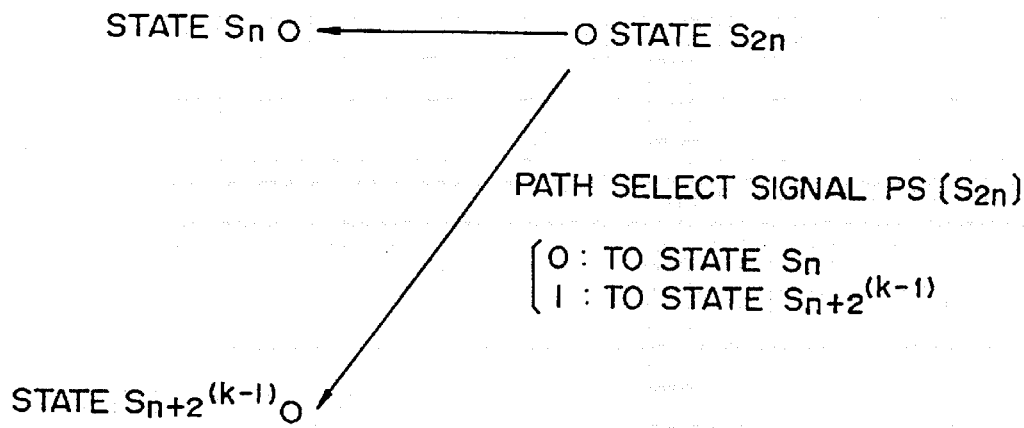
STATE AT ONE PRECEDING TIME POINT IS CALCULATED
ON THE BASIS OF STATE $S_i$ AND PATH SELECT SIGNAL PS $(S_i)$
STATE AT ONE PRECEDING TIME POINT $S_j$, $j = \frac{i}{2} + PS(S_i) \cdot 2^{(k-1)}$

ARITHMETIC APPARATUS FOR CARRYING OUT VITERBI DECODING AT A HIGH SPEED

BACKGROUND OF THE INVENTION

1. Field of the Invention

The present invention relates to an arithmetic apparatus incorporated in a digital signal processing processor adapted to perform Viterbi decoding of convolutionally coded data for error correction.

2. Description of the Related Art

In recent years, the digital signal processing processor (hereinafter abbreviated as DSP) has been highlighted as a processor used for incorporation into apparatus such as for example a portable telephone in accordance with a trend toward digitization in the mobile communication field. In data communication in mobile radio circuits, bit errors are generated frequently and an error correction processing must be carried out. One error correction technique uses Viterbi decoding for convolutional codes and the DSP is sometimes used for the error correction processing.

The Viterbi decoding is for realizing maximum likelihood decoding of a convolutional code by repetition of the simple processings of addition, comparison and selection and by a trace back operation for final decoding of data. In the Viterbi decoding, each time that coded data (receiving data series) corresponding to one bit of the information bits is obtained, inter-signal distances (metrics) of paths associated with individual states at that time are calculated to determine survivor paths.

In a convolutional decoder having a constraint length of k, two paths representative of state transitions to a state $S_{2n}$ (n being positive integer) at a certain time point from a state $S_n$ and a state (equation 1) at a one preceding time point extend as shown in FIG. 1.

$$S_{n+2^{(k-1)}} \quad (1).$$

A path metric a is the sum of an inter-signal distance (branch metric) between an output symbol of each path coming into the state $S_{2n}$ and the receiving data series and a path metric indicative of a total of branch metrics of survivor paths remaining until the state $S_n$ at the one preceding time point. Similarly, a path metric b is the sum of the distance (branch metric) between the output symbol of each path coming into the state $S_{2n}$ and the receiving data series and a path metric indicative of a total of branch metrics of survivor paths remaining until the state (equation 1) at the one preceding time point. The path metrics a and b coming into the state $S_{2n}$ are compared to select one of them, which is smaller than the other, as a survivor path. Each of the processings of path metric determining addition, path metric comparison and path selection is carried out for $2^{k-1}$ states at each time point. Further, a history as to which path is selected in path selection needs to be left in the form of a path select signal $PS[S_i]$, ($i=0 \sim \{2^{k-1}-1\}$). When a suffix of a state at the one preceding time point with which a selected path is associated is smaller than suffixes of the other state at the one preceding time point, $PS[S_i]=0$ is held but when not smaller, $PS[S_i]=1$ is held. Upon final decoding through trace back operation, survivor paths are traced back on the basis of select signals to perform decoding of data.

The path associated with the state $S_{2n}$ (n being positive integer) at the certain time point is traced back until the state $S_n$ or state (equation 1) at the one preceding time point on the basis of the select signal $PS[S_{2n}]$, as shown in FIG. 2.

Generally, a state at the one preceding time point can be expressed on the basis of a state Si and a path select signal $PS[S_i]$ pursuant to equation 2.

$$S_j, j = \frac{1}{2} + PS[S_i] \cdot 2^{(k-1)} \quad (2)$$

In that case, when a convolutional code with tail bits is used, the path select can be determined as decoded data.

FIG. 3 is a block diagram showing an arithmetic apparatus incorporated in a conventional DSP for Viterbi decoding.

In FIG. 3, a data memory 1 stores path metrics, path select signals and decoded data. A barrel shifter 3 shifts data read out of the data memory 1. A first bus 6 is coupled to the data memory 1 to effect supply of data and storage of operation results. A first register 7 holds the number of shift bits (a shift bit number) by which the barrel shifter 3 shifts the data. An arithmetic and logic operation unit (hereinafter simply referred to as ALU) 8 performs arithmetic and logic operations. A first latch 9 temporarily stores a value of the left input of the ALU 8. A second latch 10 temporarily stores a value of the right input of the ALU 8. A plurality of second registers 11 and 12 temporarily store operation results. A second bus 13 effects data supply from the register 11 or 12. The number of shift bits for the barrel shifter 3 is represented by the two's complement system, and right shift is carried out when the shift bit number is positive but left shift is carried out when negative.

In the arithmetic apparatus constructed as above, when coded data subject to convolutional coding ending in a trail bit undergoes Viterbi decoding, trace back operation is carried out as will be described below. Conditions therefor are such that the constraint length of a convolutional code is k, the number of bits of coded information is n, and each of the data memory 1, first bus 6, second bus 13, first latch 9, second latch 10, ALU 8 and second registers 11 and 12 has a bit width of $2^{k-1}$ bits. Further, path select signals $PS_t[S_i]$, ($t=0 \sim \{(n-1)+(k-1)\}$, $i=0 \sim \{2^{k-1}-1\}$) are packed in one word in the form of a path memory (equation 3) and stored in the data memory in the form of PM[t], ($t=0 \sim \{(n-1)+(k-1)\}$).

$$PM[t]=\{PS_t[S_2^{(k-1)}-1], PS_t[S_2^{(k-1)}-2], \ldots, PS_t[S_1], PS_t[S_0]\} \quad (3).$$

Decoded data Y[i], ($i=0 \sim \{n-1\}$) is stored in the data memory 1 in a unit of one word for one bit.

The trace back operation is divided into steps which will be described below.

(1) A fixed value [0] is stored in the second latch 10. The ALU 8 stores the value of the second latch 10 as it is in the second register 11.

Thus, "The operation starts from state 0." is fulfilled.

In the following steps (2) to (10), i is counted down from $\{(n-1)+(k-1)\}$ to $(k-1)$ to repeat the operations by n.

(2) The value of the second register 11 is stored in the first latch 9 through the second bus 13. The ALU determines the two's complement of the value of the first latch 9 and stores it in the second register 12.

(3) The value of the second register 12 is stored in the first register 7 through the first bus 6.

Thus, "This value is a shift bit number for selection of the next path select signal." is fulfilled.

(4) A path memory PM[i] is read out of the data memory 1, shifted by means of the barrel shifter 3 by a shift bit number designated by the first register 7, and stored in the second latch 10. The ALU 8 stores the value of the second latch 10 as it is in the second register 12.

Thus, "A path select signal to be selected is put to the least significant bit (LSB)." is fulfilled.

(5) The value of the second register 12 is stored in the first latch 9 through the second bus 13 and a fixed value [1] is stored in the second latch 10. In the ALU 8, the values of the first and second latches 9 and 10 are ANDed and a resulting product is stored in the second register 12.

Thus, "Only the LSB is extracted." is fulfilled.

(6) The value of the second register 12 is stored as decoded data Y[i−(k−1)] in the data memory.

Thus, "The LSB is the decoded data." is fulfilled.

(7) A fixed value [k] is stored in the first register 7.

(8) The value of the register 12 is stored in the first latch 9 through the second bus 13, and an output obtained by shifting the value of the second register 12, sent through the first bus 6 to the barrel shifter 3, by means of the barrel shifter by a shift bit number designated by the first register 7 is stored in the second latch 10. In the ALU 8, the values of the first and second latches 9 and 10 are ORed and a resulting sum is stored in the second register 12.

(9) A fixed value [−1] is stored in the first register 7.

(10) An output obtained by shifting the value of the second register 12 by means of the barrel shifter 3 by a shift bit number designated by the first register 7 is stored in the second latch 10. The ALU 8 stores the value of the second latch 10 as it is in the register 12.

Thus, "The state at the one preceding time point is calculated through steps (6) to (10)." is fulfilled.

In the above conventional arithmetic apparatus, by carrying out operations by using the barrel shifter 3 and ALU 8 in combination in this manner, the trace back operation in Viterbi decoding of n-bit information bit can be accomplished through (9n+1) steps.

When the operation bit width is smaller than the state number $2^{k-1}$ or the convolutional code does not end in the trail bit but is used continuously, trace back operation can also be carried out in a similar way.

In the above conventional arithmetic apparatus, however, many operation steps are needed to determine the state at the one preceding time point and decoded data is stored in a unit of one word for one bit, raising a problem that the capacity of the data memory is increased.

SUMMARY OF THE INVENTION

The present invention intends to solve the conventional problems and it is an object of the present invention to provide an excellent arithmetic apparatus which can perform operations through a reduced number of operation steps and by using a data memory of smaller capacity.

To accomplish the above object, the present invention comprises a memory for storing data, a barrel shifter for shifting data read out of the memory, a shift register which receives a shift input of specified one bit of data standing for an output signal of the barrel shifter and has the function to perform data loading from the memory and data storage into the memory, and an inverter for inverting a specified register output from the shift register, data standing for an output signal of the inverter is used as a shift bit number for the barrel shifter and while the data read out of the memory is shifted by means of the barrel shifter by the shift bit number indicated by the data standing for the output of the inverter, the data standing for the output signal of the barrel shifter is inputted to the shift register.

Accordingly, in accordance with the present invention, the state at one preceding time point can be determined by merely inputting a path select signal selected by shifting a path memory read out of the data memory by means of the barrel shifter, the next shift bit number for the barrel shifter can be determined, and the path select signal stored in the shift register can be determined as decoded data, so that trace back operation in Viterbi decoding can be carried out through a reduced number of operation steps and by using the data memory of smaller capacity.

BRIEF DESCRIPTION OF THE DRAWINGS

FIG. 1 is a state transition diagram (trellis diagram) showing paths of state transition in a convolutional coder in Viterbi decoding.

FIG. 2 is a state transition diagram (trellis diagram showing trace back of paths upon trace back operation in Viterbi decoding.

DESCRIPTION OF THE PREFERRED EMBODIMENTS

Figure 3:
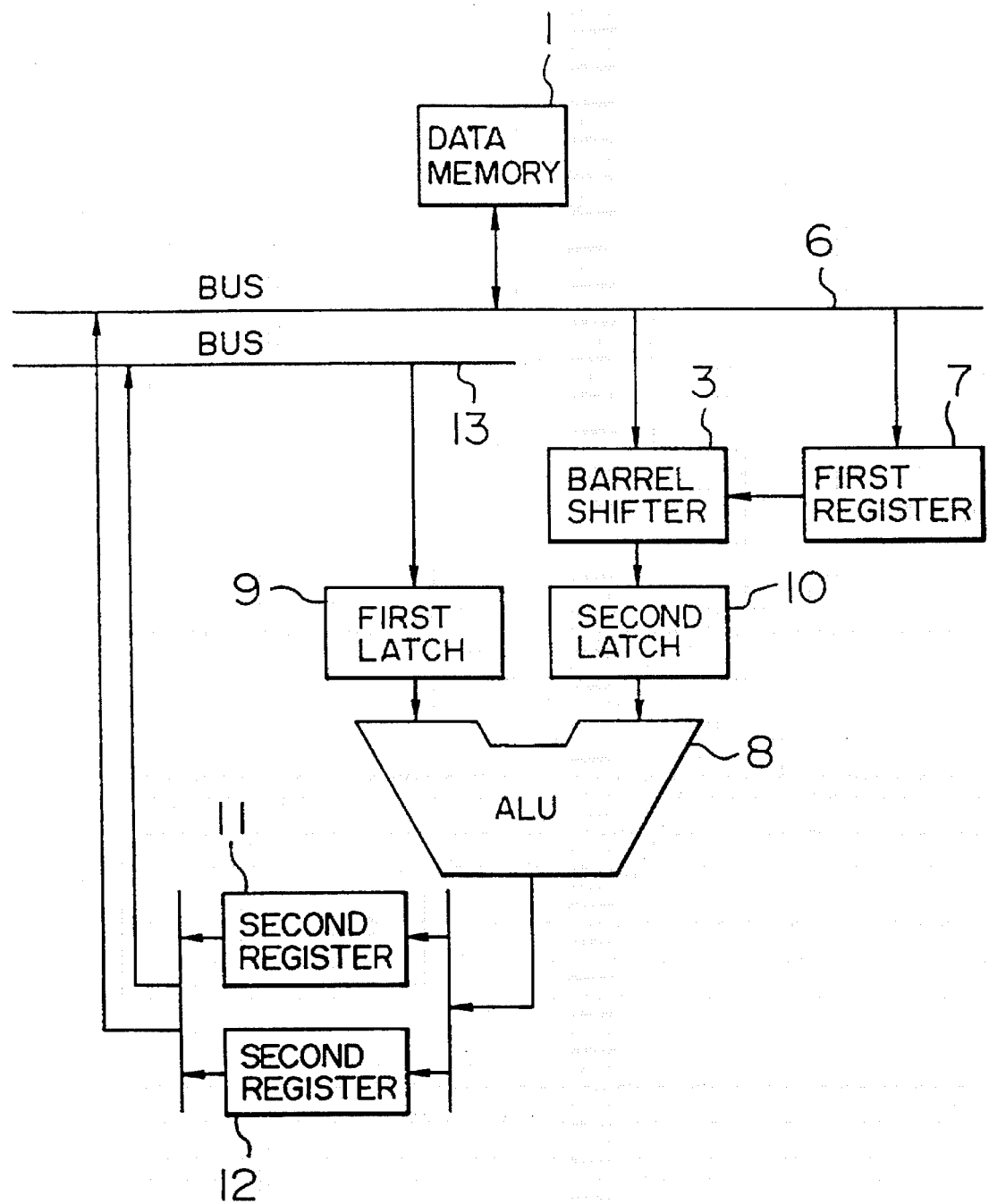
FIG. 3 is a block diagram showing a configuration of a conventional arithmetic apparatus for Viterbi decoding.
Figure 4:
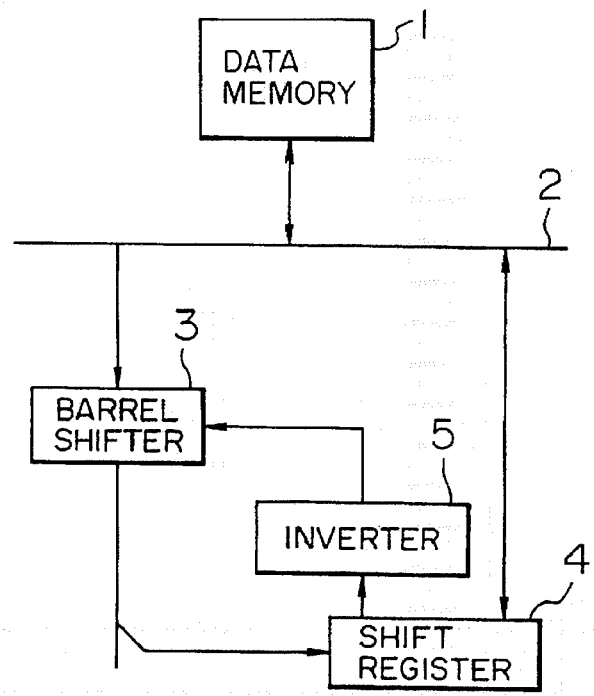
FIG. 4 is a block diagram showing a configuration of an arithmetic apparatus for Viterbi decoding according to an embodiment of the invention.

FIG. 4 is a block diagram showing a configuration of an arithmetic apparatus for Viterbi decoding according to an embodiment of the invention.

Referring to FIG. 4, a data memory 1 stores path metrics, path select signals and decoded data. A bus 2 is coupled to the data memory 1 to effect supply of data and storage of operation results. A barrel shifter 3 shifts data read out of the data memory 1. A shift register 4 can receive a shift input of specified one bit of an output of the barrel shifter 3 and it performs, through the bus 2, data loading from the data memory 1 or data storage into the data memory 1. An inverter 5 inverts a specified register value of the shift register 4 to produce a shift bit number applied to the barrel shifter 3. The shift bit number of the barrel shifter 3 is represented by the two's complement system, and right shift is carried out when the shift bit number is positive but left shift is carried out when negative. In the shift register 4, the most significant bit (MSB) lies on the shift input side.

In the arithmetic apparatus constructed as above, when coded data subject to convolutional coding ending in a trail bit undergoes Viterbi decoding, trace back operation is carried out as will be described below. Conditions therefor are such that the constraint length of a convolutional code is k, the number of bits of coded information is n, and each of the data memory 1, bus 2 and shift register 4 has a bit width of $2^{k-1}$ bits. The MSB of an output of the barrel shifter 3 is inputted as a shift input to the shift register 4, and the inverter 5 inverts the upper (k−1) bits of the shift register 4 and adds the MSB, which is 0 (zero), to its output (k−1) bits to produce k bits which is used as a shift bit number for the barrel shifter 3. Further, path select signals $PS_i[S_i]$, (t=0~{(n−1)+(k−1)}, i=0~{$2^{k-1}$−1}) are packed in one word in the form of a path memory (equation 3) and stored in the memory 1 in the form of PM[t], (t=0~{(n−1)+(k−1)}).

Decoded data Y[i], (i=0~{n−1}) is packed in a unit of one word of $2^{k-1}$ bits and stored in the data memory 1.

The trace back operation is divided into steps which will be described below.

(1) A fixed value [0] is stored in the shift register 4.

Thus, "The operation starts from state 0." is fulfilled.

In the following steps (2) and (3), i is counted down from {(n−1)+(k−1)} to (k−1) to repeat the operation by n.

(2) A path memory PM[i] is read out of the data memory 1, shifted by means of the barrel shifter 3 by a shift bit number designated by the output of k bits of the inverter 5, and the MSB of the output of the barrel shifter 3 is inputted as a shift input to the shift register 4.

Thus, "A path select signal to be selected is put to the MBS.", "Upper (k−1) bits after shift input indicates the state at one preceding time point." and "At the same time, inversion of the upper (k−1) bits provides the basis for the bit shift number for selection of the next select signal." are fulfilled.

(3) Each time that $2^{k-1}$ bits are decoded, the contents of the shift register 4 is stored in the data memory.

Thus, "The selected path select signal is the decoded data." is fulfilled.

As described above, in accordance with the present embodiment, the selection of the path select signal and the calculation of the state at one preceding time point can be carried out in step (2) and therefore, the trace back operation in Viterbi decoding of n-bit information bit can be accomplished through {n+(n/$2^{k-1}$)+1} steps.

Figure 5:
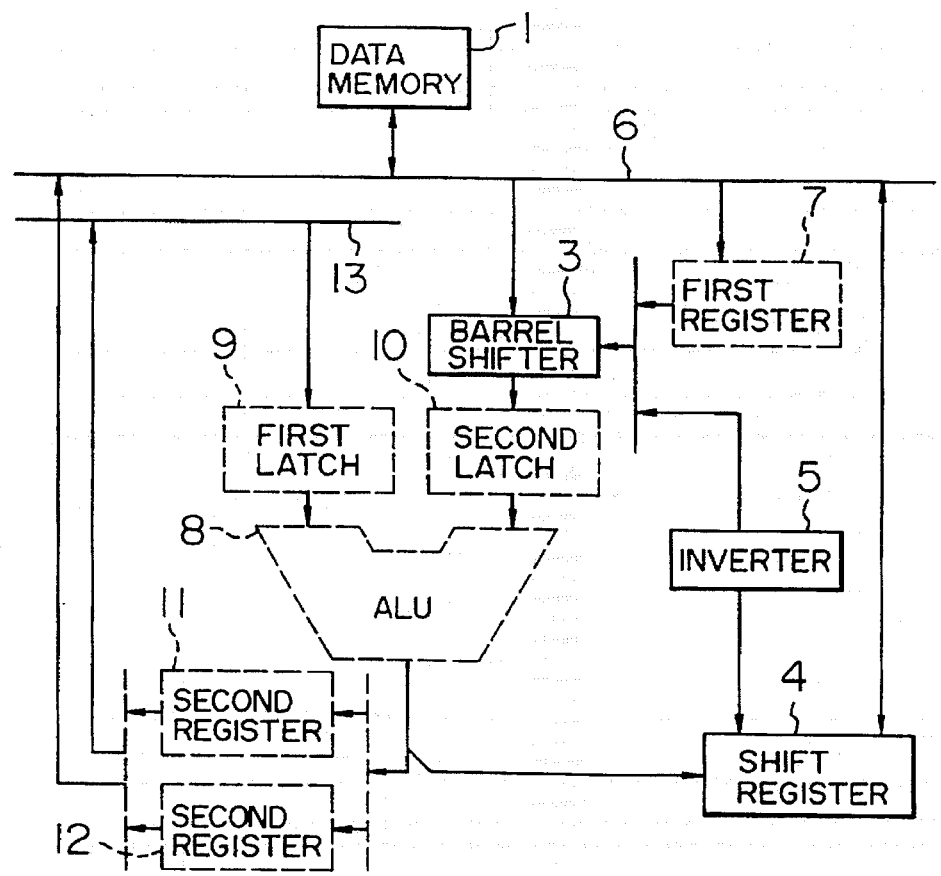
FIG. 5 is a block diagram showing a configuration of an arithmetic apparatus for Viterbi decoding according to another embodiment of the invention.
Figure 6:
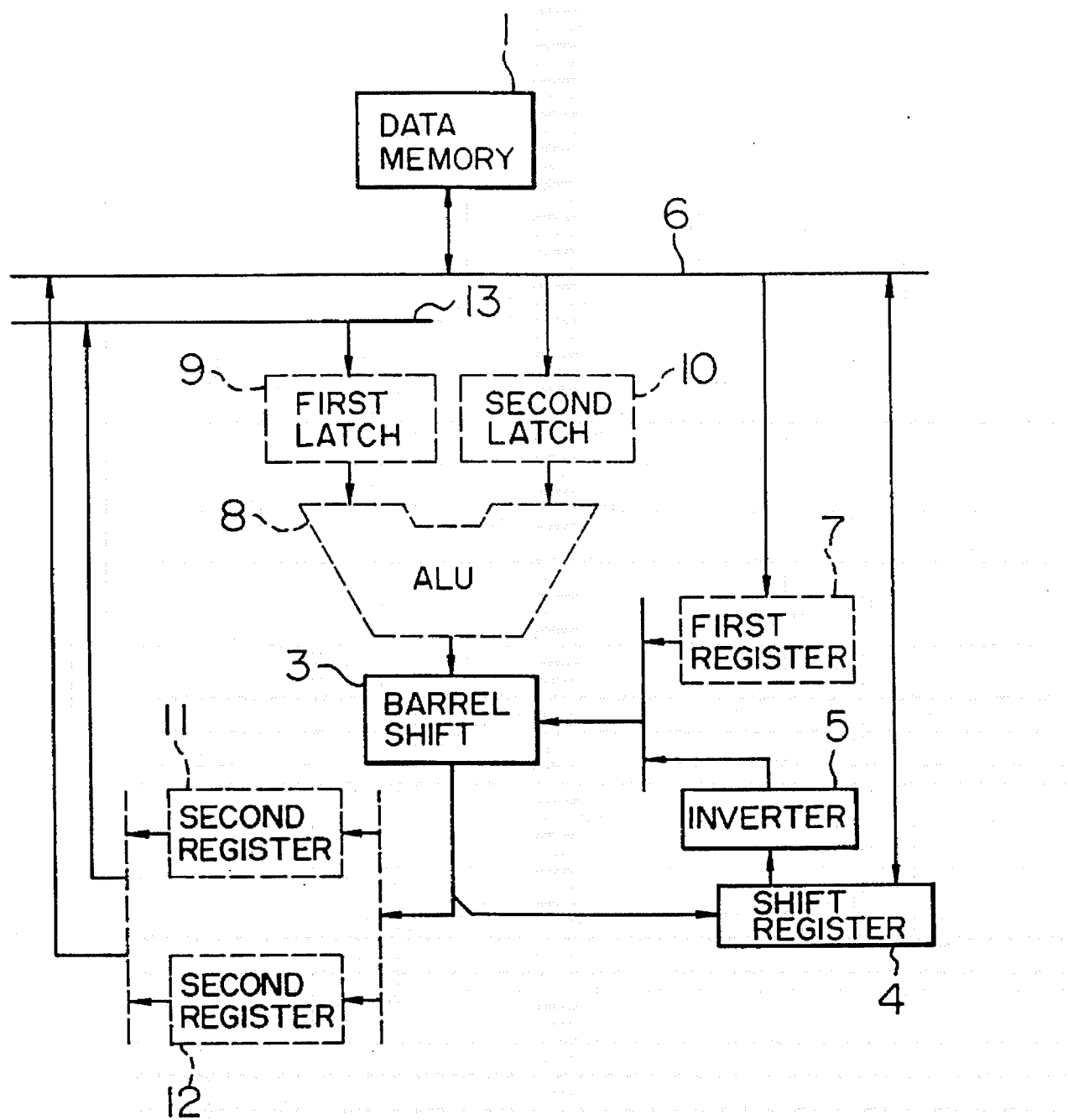
FIG. 6 is a block diagram showing a configuration of an arithmetic apparatus for Viterbi decoding according to still another embodiment of the invention.

FIGS. 5 and 6 are block diagrams showing configurations of arithmetic apparatus according to other embodiments of the invention. In FIGS. 5 and 6, the configuration shown in FIG. 4 is added with a first register 7, an ALU 8, a first latch 9, a second latch 10, second registers 11 and 12 and a second bus 13 which are necessary for performing other processings than the trace back operation in Viterbi decoding.

When the operation bit width is smaller than the state number $2^{k-1}$ or the convolutional code does not end in the trail bit but is used continuously, the trace back operation can also be carried out in a similar way.

Figure 7:
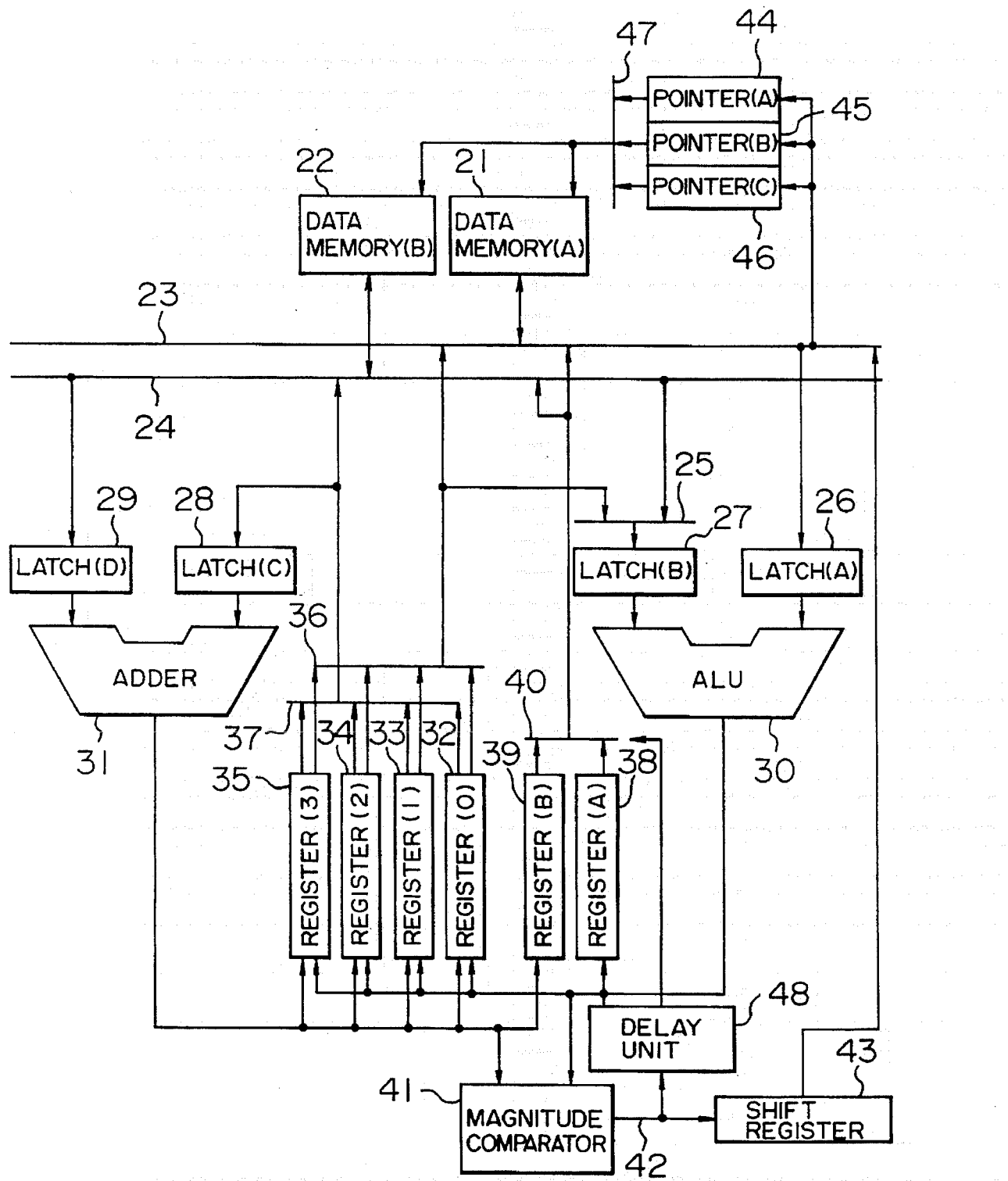
FIG. 7 is a block diagram showing a configuration of an arithmetic apparatus according to still another embodiment of the invention.

FIG. 7 is a block diagram showing a configuration of an arithmetic apparatus according to still another embodiment of the invention. Referring to FIG. 7, first and second data memories 21 and 22 store path metrics and path select signals, buses 23 and 24 are coupled to the data memories 21 and 22, respectively, to effect supply of data and storage of operation results, a multiplexer 25 performs selection between an input from the bus 24 and an input from registers to be described later, a latch 26 temporarily stores a value to the right side input of an ALU 30, a latch 27 temporarily stores a value to the left side input of the ALU 30, a latch 28 temporarily stores a value to the right side input of an adder 31, and a latch 29 temporarily stores a value to the left side input of the adder 31. The ALOU 30 performs arithmetic and logic operation for the contents of the latches 26 and 27 and the adder 31 performs addition for the contents of the latches 28 and 29. A plurality of registers 32, 33, 34 and 35 temporarily store an operation result of the ALU 30 and adder 31, multiplexers 36 and 37 perform selection among outputs of the registers 32 to 35, a first register 38 temporarily stores an operation result of the ALU 30, a second register 39 temporarily stores an operation result of the adder 31, a multiplexer 40 performs selection between outputs of the registers 38 and 39, a magnitude comparator 41 compares magnitudes of outputs of the ALU 30 and adder 31 and produces a comparison result of 0 when the output of the ALU 30 is smaller than or equal to that of the adder 31 but a comparison result of 1 when the output of the adder 31 is smaller, the comparison result of the magnitude comparator 41 being representative of a path select signal 42, a shift register 43 receives the path select signal 42 as a shift input, pointers 44, 45 and 46 indicates read addresses or storage addresses of the data memories 21 and 22, a multiplexer 47 performs selection among pointer outputs, and a delay unit 48 delays the select signal 42 by one step.

Figure 8:
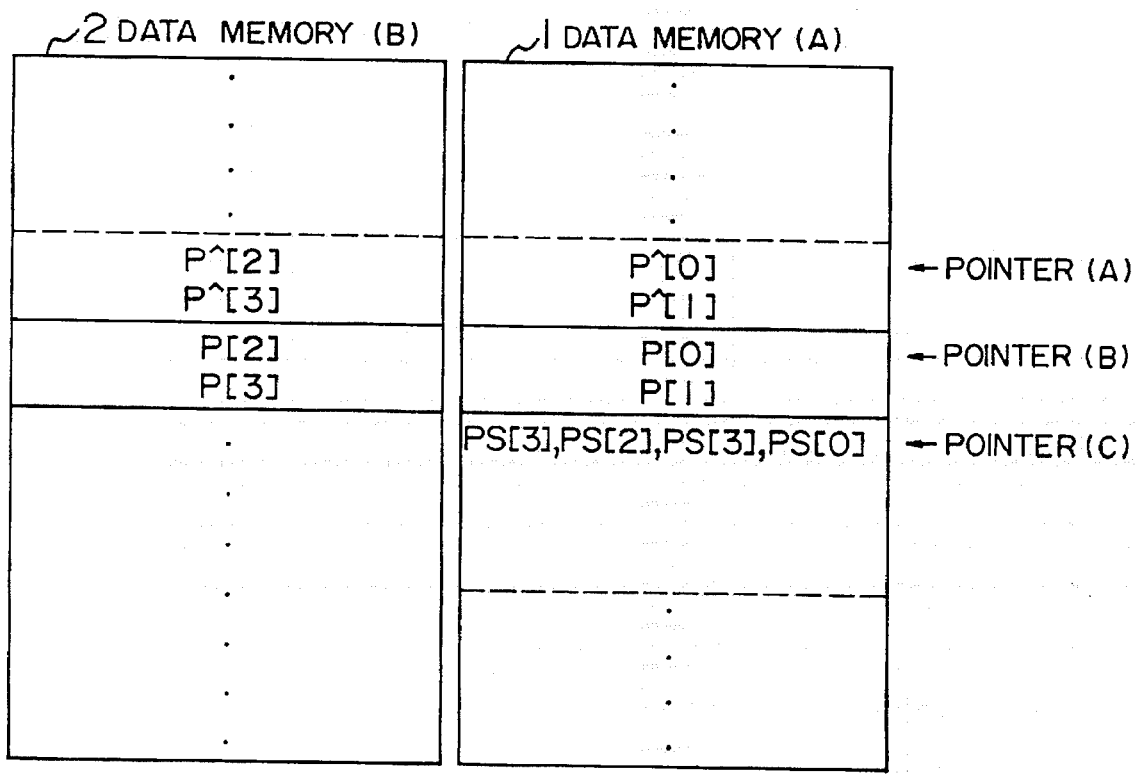
FIG. 8 is a diagram showing an example of area assignment in data memories to explain the operation of the FIG. 7 arithmetic apparatus.
Figure 9:
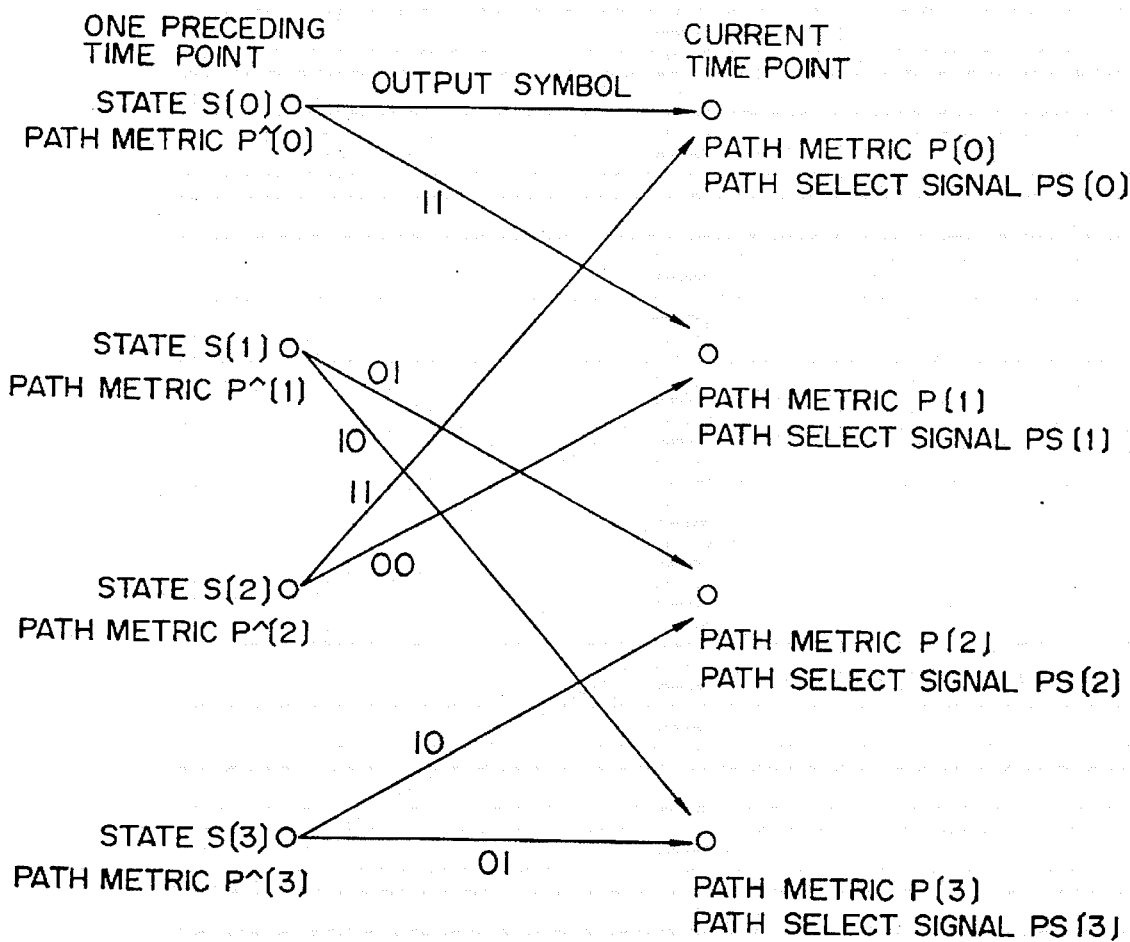
FIG. 9 is a state transition diagram showing, in connection with all states, transition from the state at one preceding time point to the state at the current time point to explain the operation of the FIG. 7 arithmetic apparatus.

In the arithmetic apparatus constructed as indicated above, when the number of states is $2^{k-1}$ at a certain time point, the operation of ACS calculation is carried out as will be described below. For simplicity of explanation, it is assumed that N=2 and k=3. In each of the data memories 21 and 22, there are provided an area for storing path metrics P'[i], (i=0~3) of individual states at one preceding time point, an area for storing path metrics P[i], (i=0~3) of the individual states obtained at the current time point and an area for storing path select signals PS[i], (i=0~3). FIG. 8 is a diagram showing an example of area assignment in the data memories 21 and 22. As initial values, the pointer 44 sets read addresses (P'[0], P'[2]), the pointer 45 sets storage addresses (P[0], P[2]) and the pointer 46 sets path select signal storage addresses. FIG. 9 shows the behavior of transition from the state at one preceding time point to the state at the current time point in connection with all of the states. In FIG. 9, at each path for transition from the state at one preceding time point to the state at the current time point, an example of output symbol inherent to the convolutional coder is described. The result of calculation of a distance between the receiving signal and each output symbol is a branch metric and the branch metrics for the same output symbol are equal to each other. Therefore, calculation of $2^2$ kinds of output symbols, that is, 00, 01, 10 and 11 suffices and the $2^2$ kinds of branch metrics which have already been calculated are stored in the registers 32, 33, 34 and 35.

The outline of operation of ACS calculation in the case of $2^2$ states at a certain time point is divided into steps as will be described below.

ACS Calculation of State S[0]

(1) Path metrics P'[0] and P'[2] are read out of the data memories 21 and 22 at addresses designated by the pointer 44 and stored in the latches 26 and 29, respectively. The content of the register 32 is stored in the latch 27 and the content of the register 35 paired with the register 32 is stored in the latch 28. The ALU 30 adds the contents of latch 26 and the contents of latch 27 and stores a result of the addition in the register 38 while applying it to one input of the magnitude comparator 41. On the other hand, the adder 31 adds the contents of latch 28 and the contents of latch 29 and stores a result of the addition in the register 39 while applying it to the other input of the magnitude comparator 41. The magnitude comparator 41 compares magnitudes of outputs of the ALU 30 and adder 31 to produce a path select signal 42. The path select signal 42 is latched in the shift register 43 and the delay unit 48. Under this condition, "The sum of P'[0] and a branch metric for output symbol 00 is determined, the sum of P'[2] and a branch metric for output symbol 11 is determined, and the comparison and selection of path metrics and the storage of path select signal are effected." is fulfilled.

(2) The content of the register 38 or 39 selected by the output of the delay unit 48 is stored in the data memory 21 at an address designated by the pointer 45.

ASC Calculation of State S[1]

(3) The content of the register 35 is stored in the latch 27 and the content of the register 32 paired with the register 35 is stored in the latch 28. The ALU 30 adds the content, which has already been stored in the latch 26 through step (1), and the content of the latch 27 and stores a result of the addition in the register 38 while applying it to one input of the magnitude comparator 41. On the other hand, the adder 31 adds the content, which has already been stored in the latch 29 through step (1), and the content of the latch 28 and stores a result of the addition in the register 39 while applying it to the other input of the magnitude comparator 41. The magnitude comparator 41 compares the magnitudes of the outputs of the ALU 30 and adder 31 to produce a path select signal 42. The path select signal 42 is latched in the shift register 43 and the delay unit 48. Under this condition, "The sum of P'[0] and a branch metric for output symbol 11 is determined, the sum of P'[0] and a branch metric for output symbol 00 is determined, and the comparison and selection of path metrics and the storage of path select signal are effected." is fulfilled.

(4) After the pointer 45 is incremented, the content of the register 38 or 39 selected by the output of the delay unit 48 is stored in the data memory 21 at an address designated by the pointer 45.

(5) The content of the pointer 45 is returned to storage addresses of (P[0], P[2]).

ASC Calculation of State S[2]

(6) After the pointer 44 is incremented, path metrics P'[1] and P'[3] are read out of the data memories 21 and 22 at addresses designated by the pointer 44 and stored in the latches 26 and 29, respectively. The content of the register 33 is stored in the latch 27 and the content of the register 34 paired with the register 33 is stored in the latch 28. The ALU 30 adds the content of latch 26 and the content of latch 27 and stores a result of the addition in the register 38 while applying it to one input of the magnitude comparator 41. On the other hand, the adder 31 adds the content of latch 28 and the content of latch 29 and stores a result of the addition in the register 39 while applying it to the other input of the magnitude comparator 41. The magnitude comparator 41 compares the magnitudes of the outputs of the ALU 30 and adder 31 to produce a path select signal 42. The path select signal 42 is latched in the shift register 43 and the delay unit 48. Under this condition, "The sum of P'[1] and a branch metric for output symbol 01 is determined, the sum of P'[3] and a branch metric for output symbol 01 is determined, and the comparison and selection of path metrics and the storage of path select signal are effected." is fulfilled.

(7) The content of the register 38 or 39 selected by the output of the delay unit 48 is stored in the data memory 22 at an address designated by the pointer 45.

ACS Calculation of State S[3]

(8) The content of the register 34 is stored in the latch 27 and the content of the register 33 paired with the register 34 is stored in the latch 28. The ALU 30 adds the content, which has already been stored in the latch 26 through step (6), and the content of the latch 27 and stores a result of the addition in the register 38 while applying it to one input of the magnitude comparator 41. On the other hand, the adder 31 adds the content, which has already been stored in the latch 28 through step (6), and the content of the latch 29 and stores a result of the addition in the register 39 while applying it to the other input of the magnitude comparator 41. The magnitude comparator 41 compares the magnitudes of the outputs of the ALU 30 and adder 31 to produce a path select signal 42. The path select signal 42 is latched in the shift register 43 and the delay unit 48. Under this condition, "The sum of P'[1] and a branch metric for output symbol 10 is determined, the sum of P'[3] and a branch metric for output symbol 01 is determined, and the comparison and selection of path metrics and the storage of path select signal are effected." is fulfilled.

(9) After the pointer 45 is incremented, the content of the register 38 or 39 selected by the output of the delay unit 48 is stored in the data memory 22 at an address designated by the pointer 45.

(10) The content of the shift register 43 is stored in the data memory 21 at an address designated by the pointer 46. Under this condition, "Path select signals for individual states at one time point are packed and stored in a unit of one word."

In this manner, in the arithmetic apparatus of the present embodiment, ASC calculation at $2^2$ states at a certain time point can be accomplished for N=2 and k=3 through steps of the order of 10 in contrast to the conventional steps of the order of 37. Generally, ACS calculation at $2^{k-1}$ states at a certain time point can be accomplished for N=N and k=k through steps of the order of $(2*2^{k-1}+1)$ in contrast to the conventional steps of the order of $(9*2^{k-1}+1)$. But when N is large or the number of registers is limited, a slight increase in the number of steps must be estimated.

An arithmetic apparatus according to still another embodiment of the present invention will now be described by making reference to FIG. 10.

Figure 10:
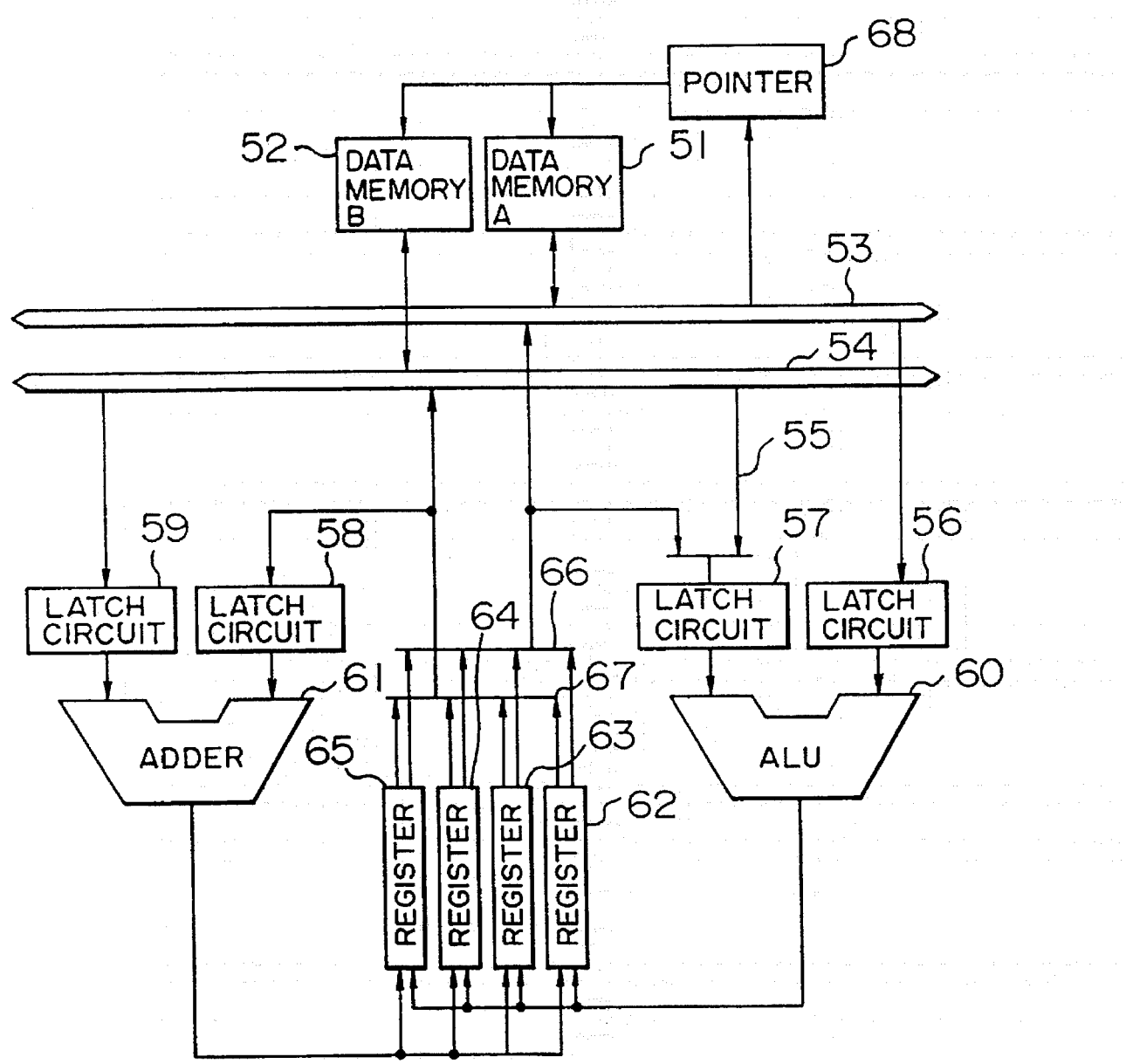
FIG. 10 is a block diagram showing a configuration of an arithmetic apparatus according to still another embodiment of the invention.

FIG. 10 is a block diagram showing a configuration of the arithmetic apparatus of the present embodiment. The arithmetic apparatus shown in FIG. 10 comprises a data memories 51 and 52 for storing receiving signals and metrics, bus lines 53 and 54 coupled to the data memories 51 and 52 to effect supply of data and storage of operation results, and a multiplexer 55 for performing selection between inputs from the bus line 54 and a multiplexer 66. The arithmetic apparatus further comprises a latch circuit 56 for temporarily storing a value to the right side input of an arithmetic and logic operation unit (ALU) 60, a latch circuit 57 for temporarily storing a value to the left side input of the ALU 60, a latch circuit 58 for temporarily storing a value to the right side input of an adder 61 and a latch circuit 59 for temporarily storing a value to the left side input of the adder 61. Also provided in the arithmetic apparatus are registers 62, 63, 64 and 65 for temporarily storing operation results, a multiplexer 66, like the multiplexer 67, for performing selection between outputs of the registers 62, 63, 64 and 65, and a pointer 68 for indicating read addresses or storage addresses of the data memories 51 and 52.

The operation of the present embodiment constructed indicated as above will now be described.

Described herein is an operation for determining $2^N$ kinds of branch metrics at a certain time point. Metrics d(R, 0) for values of receiving signals or, if the scale is realizable, for all values that receiving signals R can take are determined in advance and stored as a table in the data memory 51. Metrics d(R, 1) for all values that the receiving signals R can take are determined in advance and stored as a table in the data memory 52. In the data memories 51 and 52, d(R, 0) and d(R, 1) are stored at the same address. Receiving signals stored in the data memory 51 are used as addresses for looking up the table. When the ALU 60 and adder 61 are used at a time, the registers 62 and 65 are used in pair and the registers 63 and 64 are used in pair.

The operation for determining branch metrics will now be outlined for N=2 in the order of processings.

(1) A receiving signal Ro is read out of the data memory 51 and stored in the read pointer 68.

(2) A metric d(Ro, 0) is read out of the data memory 51 at an address designated by the pointer 68 and stored in the latch circuit 56. The ALU 60 passes therethrough the content of the latch circuit 56 and stores it in the register 62. On the other hand, a metric d(Ro, 1) is read out of the data memory 52 at an address designated by the pointer 68 and stored in the latch circuit 59. The adder 61 passes therethrough the content of the latch circuit 59 and stores it in the register 65.

(3) The ALU 60 passes therethrough the same content of the latch circuit 56 as those stored through the above processing (2) and stores the content in the register 63. On the other hand, the adder 61 passes therethrough the same content of the latch circuit 59 as that stored through the above processing (2) and stores it in the register 64.

(4) A receiving signal R1 from the data memory 51 is stored in the read pointer 68.

(5) A metric d(R1, 0) is read out of the data memory 51 at an address designated by the pointer 68 and stored in the latch circuit 56. The content of the register 62 is stored in the latch circuit 57. The ALU 60 adds the content of latch circuit 56 and the content of latch circuit 57 and stores a result of the addition in the register 62. On the other hand, a metric d(R1, 1) is read out of the data memory 52 at an address designated by the pointer 68 and stored in the latch circuit 59. The content of the register 65 is stored in the latch circuit 58. The adder 61 adds the content of latch circuit 58 and the content of latch circuit 59 and stores a result of the addition in the register 65.

Accordingly, the distance between RoR1 and 00 is determined at the register 62 and the distance between RoR1 and 11 is determined at the register 65.

(6) The content of the register 64 is stored in the latch circuit 57. The ALU 60 adds the same content of the latch circuit 56 as that stored through the above (5) and the content of the latch circuit 57 and stores a result of the addition in the register 64. On the other hand, the content of the register 63 is stored in the latch circuit 58. The adder 61 adds the same content of the latch circuit 59 as that stored through the above (5) and the content of the latch circuit 58 and stores a result of the addition in the register 63. Accordingly, the distance between RoR1 and 01 is determined at the register 63 and the distance between RoR1 and 10 is determined at the register 64.

As described above, according to the present embodiment, the processing of determining $2^2$ kinds of branch metrics for N=2 can be accomplished through steps of the order of 6. Generally, $2^N$ kinds of branch metrics can be determined for N=N through $N(2^N/2+1)$ steps. But when N is large or the number of registers is limited, a slight increase in the number of step processings must be estimated. If the provision of the tables is not practical, metrics d(R, 0) and d(R, 1) must be determined on the basis of each receiving signal, leading to a corresponding increase in the number of steps. Namely, the number of steps is comparable to the number of conventional steps.

As described above, in the arithmetic apparatus of the present embodiment, addition by the ALU and that by the adder can be carried out at a time and hence calculations of two branch metrics can be effected simultaneously. In this case, the data memory is divided into two but the size of the data memory is not increased and the number of operation steps for performing branch metric calculation can be decreased to advantage.

We claim:

1. An arithmetic apparatus for carrying out Viterbi decoding at a high speed comprising:

a memory for storing data;

a barrel shifter, operatively coupled to said memory for storing data, for shifting data read out of said memory for storing data;

arithmetic and logic operation means;

a plurality of storage means, operatively coupled to inputs of said arithmetic and logic operation means and to said barrel shifter, and used when said arithmetic and logic operation means executes processing;

a first register, operatively coupled to said barrel shifter, for holding a shift bit number by which said barrel shifter effects shifting operations;

second registers, operatively coupled to said arithmetic and logic operation means, for temporarily storing a result of operation by said arithmetic and logic operation means;

a shift register, operatively coupled to said arithmetic and logic operation means and said memory for storing data, for receiving a shift input of a specified one bit of the result of operation output from said arithmetic and logic operation means, and for performing data loading from said memory for storing data and data storage into said memory for storing data; and an inverter, operatively coupled to said shift register and said barrel shifter, for inverting a specified register output from said shift register and providing an inverted data output to said barrel shifter;

wherein the inverted data output from said inverter is used as the shift bit number for said barrel shifter, and wherein while data read out of said memory for storing data is shifted by said barrel shifter in accordance with the shift bit number designated by the inverted data output from said inverter, data output from said barrel shifter is input to said storage means, thereby carrying out a trace back processing of Viterbi decoding at a high speed.

2. An arithmetic apparatus for carrying out Viterbi decoding at a high speed comprising:

a memory for storing data;

a barrel shifter, operatively coupled to said memory for storing data, for shifting data read out of said memory for storing data;

arithmetic and logic operation means;

a plurality of storage means, operatively coupled to inputs of said arithmetic and logic operation means and to said barrel shifter, and used when said arithmetic and logic operation means executes processing;

a first register, operatively coupled to said barrel shifter, for holding a shift bit number by which said barrel shifter effects shifting operations;

second registers, operatively coupled to said arithmetic and logic operation means, for temporarily storing a result of operation by said arithmetic and logic operation means;

a shift register, operatively coupled to said arithmetic and logic operation means and said memory for storing data, for receiving a shift input of a specified one bit of the result of operation output from said arithmetic and logic operation means, and for performing data loading from said memory for storing data and data storage into said memory for storing data; and a data converting unit, operatively coupled to said shift register and said barrel shifter, for converting a specified register output of said shift register and providing a converted data output to said barrel shifter;

wherein the converted data output from said data converting unit is used as the shift bit number for said barrel shifter, and wherein while data read out of said memory for storing data is shifted by said barrel shifter in accordance with the shift bit number designated by the converted data output from said data converting unit, the data output from said barrel shifter is input to said storage means, thereby carrying out a trace back processing of Viterbi decoding at a high speed.

3. An arithmetic apparatus for carrying out Viterbi decoding at a high speed comprising:

a memory for storing data;

arithmetic and logic operation means;

a plurality of storage means, operatively coupled to inputs of said arithmetic and logic operation means and said memory for storing data, and used when said arithmetic and logic operation means executes processing;

a barrel shifter, operatively coupled to said arithmetic and logic operation means, for shifting data output from said arithmetic and logic operation means;

a first register, operatively coupled to said barrel shifter, for holding a shift bit number by which said barrel shifter effects shifting operations;

second registers, operatively coupled to said barrel shifter, for temporarily storing an output from said barrel shifter;

a shift register, operatively coupled to said memory for storing data and said barrel shifter, for receiving a shift input of a specified one bit of data output from said barrel shifter and performing data loading from said memory for storing data and data storage into said memory for storing data; and an inverter, operatively coupled to said shift register and said barrel shifter, for inverting a specified register output from said shift register and providing an inverted data output to said barrel shifter;

wherein the inverted data output from said inverter is used as the shift bit number for said barrel shifter, and wherein while the data output from said arithmetic and logic operation means is shifted by said barrel shifter in accordance with the shift bit number designated by the inverted data output from said inverter, the data output from said barrel shifter is input to said shift register, thereby carrying out a trace back processing of Viterbi decoding at a high speed.

4. An arithmetic apparatus for carrying out Viterbi decoding at a high speed comprising:

a memory for storing data;

arithmetic and logic operation means;

a plurality of storage means, operatively coupled to inputs of said arithmetic and logic operation means and said memory for storing data, and used when said arithmetic and logic operation means executes processing;

a barrel shifter, operatively coupled to said arithmetic and logic operation means, for shifting data output from said arithmetic and logic operation means;

a first register, operatively coupled to said barrel shifter, for holding a shift bit number by which said barrel shifter effects shifting operations;

second registers, operatively coupled to said barrel shifter, for temporarily storing an output signal of said barrel shifter;

a shift register, operatively coupled to said memory for storing data and said barrel shifter, for receiving a shift input of a specified one bit of data output from said barrel shifter and performing data loading from said memory for storing data and data storage into said memory for storing data; and a data converting unit, operatively coupled to said shift register and said barrel shifter, for converting a specified register output of said shift register and providing a converted data output to said barrel shifter;

wherein the converted data output from said data converting unit is used as the shift bit number for said barrel shifter, and wherein while the data output from said arithmetic and logic means is shifted by said barrel shifter in accordance with the shift bit number designated by the converted data output from said data converting unit, the data output from said barrel shifter is input to said shift register, thereby carrying out a trace back processing of Viterbi decoding at a high speed.

5. An arithmetic apparatus for carrying out Viterbi decoding at a high speed comprising:

first and second data memories having addresses designated by common pointers, wherein when one of the pointers designates an address, the same address is designated in both the first and second data memories, and wherein the first and second data memories are readable and writable simultaneously;

arithmetic and logic operation means having a first input operatively coupled to the first data memory;

an adder having a first input operatively coupled to said second data memory, for performing addition in parallel with said arithmetic and logic operation means;

a plurality of registers operatively coupled to respective second inputs of said arithmetic and logic operation means and the adder, and used in pairs when said arithmetic and logic operation means and said adder are executed simultaneously, wherein data stored in one register of a pair is input to said arithmetic and logic operation means and data stored in the other register of the pair is input to the adder simultaneously;

a magnitude comparator, operatively coupled to receive outputs from said arithmetic and logic operation means and the adder, for comparing magnitudes of the outputs of said arithmetic and logic operation means and adder to determine which of the output is smaller and producing a comparison result;

a shift register for storing the comparison result of said magnitude comparator; and first and second registers for temporarily storing operation results of said arithmetic and logic operation means and said adder and being selected by the comparison result of said magnitude comparator, the first and second data memories being selectively connected to outputs of the first and second registers, wherein if the comparison result indicates that the output of said arithmetic and logic operation means is smaller than the output of the adder, then the first register is selected, and if the comparison result indicates that the output of the adder is smaller than the output of said arithmetic and logic operation means, then said second register is selected;

wherein data stored in said first and second data memories at addresses designated by said pointers is read out and applied to respective first inputs of said arithmetic and logic operation means and said adder, and data stored in said registers used in pairs is applied to respective second inputs of said arithmetic and logic operation means and said adder to perform simultaneous additions, operation results of said arithmetic and logic operation means and said adder are provided to said first and second registers, respectively, and to said magnitude comparator, and the comparison result from said magnitude comparator is stored in said shift register.

6. An arithmetic apparatus for carrying out Viterbi decoding at a high speed comprising:

first and second data memories having addresses designated by common pointers, wherein when one of the pointers designates an address, the same address is designated in both the first and second data memories, and wherein the first and second data memories are readable and writable simultaneously;

arithmetic and logic operation means having a first input operatively coupled to the first data memory;

adder means having a first input operatively coupled to said second data memory, for performing addition in parallel with said arithmetic and logic operation means; and a plurality of storage means operatively coupled to respective second inputs of said arithmetic and logic operation means and the adder, and used in pairs when said arithmetic and logic operation means and said adder means are executed simultaneously, wherein data stored in one storage means of a pair is input to said arithmetic and logic operation means and data stored in the other storage means of the pair is input to the adder simultaneously;

wherein data stored in said first and second data memories at addresses designated by said pointers is read out and applied to respective first inputs of said arithmetic and logic operation means and said adder means, and data stored in said storage means used in pairs is applied to respective second inputs of said arithmetic and logic operation means and said adder means to cause said arithmetic and logic operation means and said adder means to perform additions, and operation results of said arithmetic and logic operation means and said adder means are again stored in said storage means used in pairs.

* * * * *